United States Patent [19]

Reichenecker

[11] Patent Number: 4,612,208
[45] Date of Patent: Sep. 16, 1986

[54] COUPLING AID FOR LASER FUSION OF METAL POWDERS

[75] Inventor: William J. Reichenecker, Penn Hills, Pa.

[73] Assignee: Westinghouse Electric Corp., Pittsburgh, Pa.

[21] Appl. No.: 725,449

[22] Filed: Apr. 22, 1985

[51] Int. Cl.$^4$ .............................................. B05D 3/06
[52] U.S. Cl. .................................. 427/53.1; 427/88; 427/123; 427/125
[58] Field of Search ................ 427/53.1, 88, 123, 125; 252/503

[56] References Cited

U.S. PATENT DOCUMENTS

| | | | |
|---|---|---|---|
| 2,196,128 | 4/1940 | Stuart | 427/53.1 X |
| 2,866,057 | 12/1958 | Peck | 252/503 X |
| 3,716,406 | 2/1973 | Scholl et al. | 427/53.1 X |
| 4,302,361 | 11/1981 | Kotani et al. | 252/503 |
| 4,532,191 | 7/1985 | Humphries et al. | 427/53.1 |
| 4,559,237 | 12/1985 | Meier et al. | 427/53.1 |

*Primary Examiner*—Thurman K. Page
*Attorney, Agent, or Firm*—Thomas R. Trempus

[57] ABSTRACT

A process for enhancing the absorbent surface characteristics of a material having low carbon solubility or whose properties are not adversely affected by alloying with carbon comprises the step of mixing the material with lampblack in order to deposit a coating of lampblack on the material. Furthermore, the lampblack acts as a deoxidizing and fluxing agent to clean the substrate surface and promote effective wetting by the molten material during a laser processing procedure.

3 Claims, No Drawings

COUPLING AID FOR LASER FUSION OF METAL POWDERS

FIELD OF THE INVENTION

This invention relates to metal working processes which utilize lasers, more particularly, this invention is directed to a technique whereby the critical characteristics of the materials being used in a metal working process employing lasers can be significantly enhanced.

BACKGROUND OF THE INVENTION

Many current carrying components require electroplated surfaces at specific locations in order to provide good electrical contact at mechanically coupled surfaces. Typically, the surface is electroplated with silver. Conventional practice usually results in the electroplating of an entire component because it is less costly than masking for selective electroplating. While the additional expense of selective masking is eliminated with this conventional technique, there is a very considerable expense in the silver utilized to provide the desired electrical contact when the entire component is electroplated with silver. It has been a long standing need within the art of electroplating to provide a technique in which the spot "plating" of copper components with silver by the controlled disposition of silver powder onto the desired area could be accomplished. Ideally, silver powder would be fused into a homogenous layer bounded to the copper component. It has also been a goal within the art to develop a technique whereby laser energy could be used to locally coat electrically conductive components such as copper components with the desired spot "plating" with silver.

The combination of the laser and the robot has added a powerful new tool to industry. Unfortunately, certain lasers present specific limitations in their use for metal processing. This is particularly true because each material absorbs, reflects and transmits a specific laser wavelength differently. Accordingly, the opitmal laser for each material is different. The best laser for an installation must be selected after an in-depth study of the particular scope of work. Thus, by way of an example, a $CO_2$ laser is not used in material applications in which brass is present while a YAG laser has shown to be fair to good in such applications. This problem results due to the difficulty of obtaining coupling between the laser beam and the reflective substrate.

It is therefore an object of this invention to provide a process whereby effective coupling between the laser beam and the material powder to be disposed onto a substrate can be consistently obtained.

It is another object of this invention to provide a process whereby both deoxidizing and fluxing action can be effectively promoted during laser material processing.

It is yet another object of this invention to provide a process for the selective spot "plating" of a component so that significant cost reductions can be had through minimizing the use of expensive materials.

It is yet another object of this invention to provide a method which replaces the current electroplating techniques which require tedious masking with an automated system for the seletive spot plating of a component.

It is another object of this invention to provide a process whereby significantly thicker, adherent metal coatings can be achieved than by conventional electroplating techniques.

It is still another object of this invention to provide a process for enhancing the absorbant surface characteristics of both the cladding material and the substrate with a material that is insoluble with both the cladding material and substrate.

SUMMARY OF THE INVENTION

This invention is a process which provides the effective coupling between a laser beam and the materials having low carbon solubility or whose properties are not adversely affected by alloying with carbon. This effective coupling can be obtained by mixing lampblack with the selected material powder. The lampblack provides a much more absorbant surface characteristic for the laser beam and yet is insoluble with selected material powders and substrates. Thus no contamination of the molten metal pool results. Furthermore, the nature of lampblack is such that if a mixture of lampblack and the selected powder is tumble mixed, the lampblack will evenly coat the surface of each powder particle enhancing the powder flow and handling characteristics. Furthermore, although conventional wisdom holds that carbon or lampblack contaminated surfaces are difficult to wet with a liquid metal, I have found that the lampblack acts as a deoxidizing and fluxing agent to clean the substrate surface and promote effective wetting by the molten material during the laser processing procedures.

DETAILED DESCRIPTION OF THE INVENTION

Lasers are performing a variety of metal working processes, with the largest number of applications directed toward cutting metals. Other processes such as welding, drilling, heat treating, cladding, gaging and inspection, as well as marking, are also possible through the use of lasers. The present invention provides a process for enhancing the absorbent surface characteristics of a material in order to facilitate the processing thereof. More particularly, I have discovered a process for the effective coupling of a laser beam and silver powder in order to locally coat copper with silver for a variety of applications. Silver powder is mixed with lampblack which provides a much more absorbant surface characteristic for the laser beam and yet is insoluble in the liquid silver. When spot plating a copper substrate with a local coat of silver, I have found that the lampblack is also insoluble in the copper. Thus, no contamination of the molten metal pool results. Furthermore, the nature of lampblack is such that if a mixture of lampblack and silver powder is tumble mixed, the lampblack will tend to smear over and coat the surface of each powder particle. More particularly, this process consists of mixing approximately two percent carbon lampblack with 200 mesh silver powder, placing it on the copper substrate and administering a focused laser beam to it. Preferably, adequate shielding with inert gas is provided to minimize the reaction of superheated carbon with oxygen in the air. This reaction generates CO and $CO_2$ which can cause the silver carbon mixture to be blown away from the substrate.

I have experimentally demonstrated that the plating with silver powder of a copper substrate provides acceptable local spot plating. Additionally, the lampblack enhances the coupling between the laser beam and the silver powder thus permitting the powder to be fused into a continuous bead of silver bonded to the copper substrate. The lampblack also appears to enhance the flow characteristics of the silver powder when it is being dispensed. Silver powder alone, without the lampblack addition is difficult to dispense in a smooth, thin layer onto the substrate. The lampblack apparently acts as a "lubricant" for the silver powder particles so that there is less tendency for the silver particles to adhere together. The lampblack also appears to provide positive fluxing since excellent wettability is demonstrated by this process.

Additionally, I have determined that the technique of adding lampblack to a powder material prior to laser application is possible for materials having low carbon solubility or materials whose properties are not adversely affected by alloying with copper. By way of example, the following materials can be successfully mixed with lampblack in order to enhance their metal working properties: silver (Ag), aluminum (Al), arsenic (As), gold (Au), bismuth (Bi), cadmium (Cd), copper (Cu), indium (In), palladium (Pd), tin (Sn), and zinc (Zn).

Thus, the process of this invention can be applied to electrical contacts where pure silver or pure gold electroplated surfaces are utilized for sliding contacts and where gold or silver "buttons" are brazed in place on a conductor for a contacts in switches, relays, etc. Thus, surfaces can be locally coated with silver or gold using the lampblack addition to the silver or gold powder to aid coupling and act as a flux for laser fusion. Also, where a contact button is required, the lampblack gold or silver powder mixture can be fused in place on a conductor by laser and die coined to form the desired contact button. Thus, no separate brazing operation would be required. It should further be appreciated that the lampblack can be mixed with powdered silver brazing alloys such as PHOS-COPPER and PHOS-SILVER brazing alloys for laser brazing applications. The lampblack can be mixed with powdered solder alloys for laser soldering.

The lampblack can be used in colloidal suspension painted or sprayed on surfaces as a coupling aid and ablative coating for shock hardening by laser. Lampblack can be brushed, dusted or sprayed in a liquid vehicle on copper for laser welding to obtain good coupling. Lampblack can also be brushed, dusted or sprayed in a liquid suspension on gold where laser heat is used for joining.

Lampblack can be used with powdered tin or powdered solder mixtures when locally applied and laser fused, to obtain thin, uniform tinned or solder coated surfaces for corrosion protection or cosmetic purposes. This technique can also be used in other applications such as assembly and soldering by conventional practices where the control of the thickness of the tinned or soldered coated area is necessary to maintain good fit-up and joint clearances. Obviously, this approach is useful for tinning or solder coating printed wire circuitry.

When using the process of this invention in which lampblack is mixed with a powder material prior to the application of laser power, it should be appreciated that the laser can be used to essentially program specific designs into areas to be coated with silver, gold, tin or soldered alloys, by using the method of this invention as opposed to current electroplating approaches which require masking. Thus, using the teachings of this invention, the locations not fused by the laser would remain coated only with loose powder which could then be brushed, dumped or vacuumed off the part and reused. Thus, only the portion of the powder material contacted by the laser would be fused to substrate. The result would be essentially no loss of material while proving a highly flexible or programmable spotting or cladding pattern on the substrate with the desired material.

What has been described is a technique which permits the affective coupling between a laser beam and a highly reflective powder such as silver or the like to a copper substrate by means of a $CO_2$ laser which had heretofore been considered not applicable due to the wavelength of the $CO_2$ laser and the high reflectivity of the silver powder. This process enhances the absorbent surface characteristics of the material and more particularly, with certain selected materials proves to be insoluble when that material is liquid and thus does not contaminate that material during the laser metal processing procedures.

What is claimed is:

1. A process for the effective coupling of a laser beam and silver powder on a copper substrate comprising the steps of:
   mixing the silver powder with lampblack powder so that the silver powder is coated with lampblack;
   depositing the silver powder with lampblack mixed together therewith onto a copper substrate; and
   applying laser power to the deposited mixture of silver powder and lampblack powder.

2. A process for cladding copper with a highly reflective material comprising the steps of:
   mixing said highly reflective material with lampblack so that a mixture of lampblack and said material is rendered;
   depositing said mixture of highly reflective material and lampblack onto the substrate; and
   applying laser power to said mixture on said substrate.

3. A process for applying a specific design to substrate by coupling a material selected from the group consisting of silver, gold, tin and solder alloys to said substrate, comprising the steps of:
   mixing said selected material with lampblack to form a loose powder mixture;
   substantially covering said substrate with said loose powder mixture;
   applying laser power to the specific design areas of said substrate on which said loose powder mixture is to be coupled to said substrate while an area of said substrate to which laser power was not applied remains substantially covered with uncoupled loose powdered mixture; and
   removing said loose powder mixture remaining on said substrate, thereby rendering said specific design applied to said substrate.

* * * * *